United States Patent [19]

Sullivan

[11] Patent Number: 4,826,631
[45] Date of Patent: * May 2, 1989

[54] COATING FOR EMI SHIELDING AND METHOD FOR MAKING

[75] Inventor: F. Ryan Sullivan, Cleveland Heights, Ohio

[73] Assignee: The B. F. Goodrich Company, Akron, Ohio

[*] Notice: The portion of the term of this patent subsequent to Dec. 29, 2004 has been disclaimed.

[21] Appl. No.: 99,571

[22] Filed: Sep. 22, 1987

Related U.S. Application Data

[63] Continuation-in-part of Ser. No. 821,310, Jan. 22, 1986, Pat. No. 4,715,989.

[51] Int. Cl.$^4$ .................................. A01B 1/06
[52] U.S. Cl. ..................... 252/512; 252/513; 252/514; 252/518; 252/519; 252/506; 252/510; 252/511; 524/414; 524/439; 524/440; 523/137; 523/201; 523/220
[58] Field of Search ............... 252/512, 513, 514, 518, 252/519, 511, 502, 506, 510; 523/137, 201, 220, 215, 216; 524/401, 439, 440, 414

[56] References Cited

U.S. PATENT DOCUMENTS

| 4,159,364 | 6/1979 | Craig | 428/334 |
| 4,209,425 | 6/1980 | Lin et al. | 252/510 |
| 4,474,685 | 10/1984 | Annis | 252/511 |
| 4,493,912 | 1/1985 | Dudgeon et al. | 523/137 |
| 4,518,524 | 5/1985 | Stoetzer | 252/514 |
| 4,566,990 | 1/1986 | Lin et al. | 252/514 |
| 4,569,786 | 2/1986 | Deguchi | 252/512 |

FOREIGN PATENT DOCUMENTS 117269 9/1984 European Pat. Off. .
58-221206 12/1983 Japan .

OTHER PUBLICATIONS

42 Coatings, vol. 93 (1980) p.p. 89.
ASTM Designation: D 869-78.
An Inco Company brochures "Conductive Nickel Pigments".
H. G. Dawson, "Mechanical Stability Test for Hevea Latex," Analytical Chemistry, vol. 21, No. 9, (Sept., 1949).
"Latex Technology", Kirk-Othmer, 3rd ed., vol. 14, pp. 86-89.
ASTM Designation: D1210-79 (reapproved 1983), Standard Test Method for "Fineness of Dispersion of Pigment-Vehicle Systems".

Primary Examiner—Josephine Barr
Attorney, Agent, or Firm—Woodrow W. Ban; Thoburn T. Dunlap

[57] ABSTRACT

An aqueous based electrically conductive paint having substantially enhanced settling properties employing a nickel pigment and a surfactant having substantial unsaturation characteristics. Paint is held at 50° F. or greater for at least one hour requires no aging before use. The paint finds particular application in providing EMI and RFI shielding for electrical components when applied to cabinetry housing such components.

31 Claims, No Drawings

COATING FOR EMI SHIELDING AND METHOD FOR MAKING

RELATED APPLICATION DATA

This application is a continuation-in-part of U.S. Ser. No. 821,310, 1/22/86, now U.S. Pat. No. 4,715,989.

FIELD OF THE INVENTION

This invention relates to paint coatings, and more particularly to paint coatings containing conductive particles such as metal particles. More specifically this invention relates to nickel containing water based paints for providing EMI shielding to enclosures for electronic components.

BACKGROUND OF THE INVENTION

It has been long known that paint coatings could be made electrically conductive by the inclusion therein of particulates comprised of matter having substantial electrical conductivity properties. A number of paints are known incorporating electrically conductive metal particles or particles of carbon therein which can function to conduct static electricity, for example, accruing in a structure which the paint is protecting.

More recently, with the advent of elaborate solid state circuitry devices the requirements for performance characteristics of conductive coatings have become more stringent. These solid state devices include electronic memory devices susceptible to so-called EMI (electromagnetic wave interference) or RFI (radio frequency interference). EMI and RFI have demonstrated a capability for deprogramming memory devices and a potential for ruining circuitry thus rendering complicated electronic circuitry devices useless. In the past, EMI or RFI sensitivity was not of particular concern to the electronics industry as electronics devices typically were housed in metallic housings which functioned at least in part also to shield electronic devices from EMI or RFI interference.

More recently, electrically non-conductive (relatively) plastics have found increasing use in forming cabinetry for containing electronic components and, typically, such plastics are sufficiently electrically non-conductive whereby, unlike metal housings, no significant shielding from RFI or EMI electromagnetic radiation is achieved.

Electrically conductive paints have therefore achieved a certain acceptance in imparting electromagnetic radiation protection to electronic circuitry contained in plastic cabinetry. Such conductive paint coatings are applied typically to interior surfaces of cabinetry encapsulating electronic components and then are grounded in suitable or conventional fashion to dispose properly of electrical energy generated by impinging electromagnetic radiation.

Such paint coatings configured for protecting electronic devices from EMI and RFI electromagnetic radiation must provide substantial conductivity to be effective. While various entities within the electronics industry have varying standards for measuring the conductivity performance for such coatings, it would appear that a generally universal performance standard for EMI/RFI cabinetry protection of about 1 $\Omega$/square after aging would appear to be emerging. Particularly in the range of 30 megahertz to 1 gigahertz frequencies an attenuation of at least 30 db is considered adequate for most shielding application in a shielding coating. A 30 db reduction requires approximately a 1.3–1.5 $\Omega$/square value in the shielding coating.

It is known to formulate coatings including electrically conductive additives such as carbon or metals in particulate form where the coatings have a solvent base. More recently, coatings have been formulated having a water base and including therein electrically conductive particulates of, for example, carbon or metal particles.

A number of factors influence the acceptability of a particular coating or paint for use on a paint spraying line such as may be associated with the manufacture of cabinetry for electronics components, having an applied EMI/RFI paint coating upon inner surfaces of the cabinetry. Desirably, such coatings:(i) should be air dryable rather than requiring oven drying; (ii) should be substantially free from a tendency for rapid settling of any included particulates whereby constant or frequent agitation of the coating during application procedures on the spraying line is not necessary and whereby upon shutdown of a production spray line for an extended period such as over a weekend, settling in spray hoses, nozzles and paint containers will not cause deleteriously affect spray line operations upon startup; (iii) should have good properties of adhesion to the plastic cabinetry to which it is applied; (iv) should have outstanding storage stability; (v) especially with reference to desirable settling characteristics of any particulates therein; and in addition (vi) should be substantially resistant to the effects of abrasion, humidity aging, and temperature cycling once applied.

Particularly, solvent based conductive paints traditionally have included a significant quantity of included solvents which evaporate upon paint drying. The size and cost of physical equipment necessary to cope adequately with recovery of such solvents on a commercial scale, for reasons such as the prevention of air pollution or solvent reuse, can detract significantly from the desirability of using solvent based paint coatings in effecting EMI/RFI protection for electronics hardware cabinetry. Emerging statutory/regulatory postures could exclude the use of solvent based paints.

Water based coatings, often also known as latex paints, tend to evolve relatively small quantities of solvent upon drying but are more prone to difficulties with:(i) adhesion, particularly to the surfaces of certain plastics such as NORYL ®, or LEXAN ® (General Electric Co.), CALIBRE ™ or STYRON ® (Dow), CYCOLAC ® (Borg Warner), or TEMPRITE ®, FIBERLOC ® or GEON ® (B.F. Goodrich); (ii) settling problems while in use on a spray line; and (iii) a final conductivity of the coating being undesirably substantially greater than the preferred maximum of 1 $\Omega$/square. Particularly, those water based paints employing metal particles or flakes and most particularly nickel particles or flakes as the conductive particulate within the paint coating have tended to demonstrate undesirable settling characteristics and, to a considerable extent, substantially undesirable electrical conductance properties unless aged for a considerable time period, usually weeks, before application.

A water based, electrically conductive, air drying water based paint having acceptable settling and aging characteristics would have substantial application in the electronics industry, particularly where the coating resulting from application of such a paint to a plastic electronics cabinet component is a coating having an electrical conductance parameter of 1 $\Omega$/square or less where such paints or coatings can be applied and be effective immediately after manufacture.

SUMMARY OF THE INVENTION

The present invention provides an electrically conductive, water based, air dried paint including a metal (metallic) particulate material. By metal what is meant is an elemental metal, alloys of elemental metals, compounds including an elemental metal such as metal phosphides, substrates coated with a elemental metal, elemental metal alloy or such compounds, and mixtures thereof. The metal typically is gold, silver, copper, metal phosphides and the like or, preferably nickel, or may be mixtures of these or substrates coated with the metals. The particles typically are possessed of dimensions not greater than a dimension passable through the spray nozzle intended for applying the paint.

The paint of the instant invention includes a copolymeric latex, and preferably a partially cross linked copolymeric latex, with the copolymer having a backbone, and pendant acidic functional moieties therefrom in sufficient quantity to provide the copolymer with an acid number of at least about 7 but not more than about 195. The latex, typically comprising copolymeric solids suspended in a water based serum, is present in the paint in a ratio of about 15% by weight (polymer basis) to about 100% of the weight of the nickel present in the paint. This latex must be capable of withstanding exposure to a heat of at least 50° C. for at least one hour under agitation, more preferably 75° C. and most preferably 85° C. Where the metal particulate is a powder, it is necessary that the paint be subjected to elevated destructive agitation such as high shear or grinding sufficient to increase the Hegman value after agitation for the paint by 0.25.

The paint includes an air drying, preferably water soluble, co-solvent desirably having a boiling point greater than water and capable of coalescing particles of the latex to form a coherent coating upon the surface being painted. The co-solvent is present in the paint in a quantity of at least about 2% and preferably not more than 40% by weight of the copolymer in the latex. But these percentages may need to be more elevated where the paint is substantially diluted by water before application to a substrate.

The paint includes a pH adjusting compound in a quantity sufficient to adjust the pH of the paint to between about 5 and 11. A film forming enhancer such as a defoamer or a salt of at least one fatty acid is included in the paint. The salt preferably includes an unsaturated component so that the salt is possessed of an iodine value of at least about 85 but not more than about 250. The salt is present in the paint in a quantity of between about 1% by weight and about 5% by weight of the metallic particulate present in the paint. This film forming enhancer should be essentially free of silicones and silicates.

The paint of the invention optionally may be made harder when dried upon a substrate by the inclusion of a non-metallic filler such as carbon and/or silica (colloidal) in a quantity of not more than about 10% by weight and preferably not more than about 5% by weight of the weight of metal particulate contained in the paint. Where during processing, manipulation of a particular latex under agitation to produce a blended paint product produces a foaming condition, an antifoaming agent may be included in the paint in a quantity not exceeding about 1% by weight of the metal particulate in the paint whether or not a defoaming material is also employed as a film forming enhancer.

It is preferred in the practice of a invention that the latex contain particles of a size of between about 100 and 500 nanometers. The paint includes a pH adjusting compound, preferably fugitive and typically amine based. Preferably any salt of an unsaturated fatty acid comprises at least about 50% by weight of the film forming enhancer.

The paint of the instant invention is produced by agitating the polymeric latex with the antifoaming compound if any such antifoaming compound is employed. Under agitation, the co-solvent is then added to the polymeric latex, together with or typically after the co-solvent is first diluted with a quantity of water not less than about twice nor more than about 12 times by weight the quantity of co-solvent being employed. The pH adjusting compound is then introduced under agitation until the desired pH range of between about 5 and about 11 is attained. Under agitation, the film forming enhancer is then introduced into the pH adjusted mixture but not until the film forming enhancer, particularly where salts of fatty acids, has been first diluted by a quantity of water at least about twice but not more than about 10 times the weight of the film forming enhancer.

The metallic particulates are then added to the agitated mixture and optionally, agitation is continued, while the paint is held at a temperature of at least 50° C., preferably 75° C. and most preferably at least 85° C., for at least an hour. Where the metal particulate is a powder, the paint is processed through destructive agitation such as a high or elevated shear agitation device to an extent sufficient to raise the Hegman scale reading (ASTM Standard D-1210-79) by at least 0.25. The resulting mixture including metallic flake is then filtered through a mesh. The paint is then held at least one hour at not less than 50° C., preferably not less than 75° C. and most preferably not less than 85° C., optionally under agitation preferably elevated shear agitation. Where it is desired that a carbon or silica (colloidal) be present in the final paint, the carbon or colloidal silica may be introduced under agitation at any point during formulation of the paint.

The above and other features and advantages of the invention will become more apparent when considered in light of a detailed description of the invention that follows, forming a part of the specification.

BEST EMBODIMENT OF THE INVENTION

The present invention provides an electrically conductive, water based, air dried paint comprising metallic particulate, a polymeric latex, a co-solvent, a pH adjusting compound, and a film forming enhancer. The paint requires no aging, prior to use, and is made at least in part at any elevated temperature exceeding 50° C., preferably exceeding 75° C. and most preferably exceeding 85° C., and where the particles are a metal powder at some point to a destructive agitation such as an elevated shear or a grinding.

The metallic particulate typically is nickel but may be gold, silver, copper, iron phosphides such as Ferrophos available from Occidental Chemical Corp., mixtures thereof or substrates coated therewith and is possessed of a dimension not greater than a dimension passable through a spray nozzle intended for applying the paint.

It should be understood that because of the slender nature of such particles, a certain amount of momentary shape distortion during passage through a nozzle under spray conditions is inherent to the particle so that flake-like particles having a long dimension in excess of a spray nozzle opening dimension can be accommodated in the paint where the flake can bend or deform while passing through the spray nozzle. It is preferred that any such particulate, where a flake, be not more than about 1.5 microns in thickness.

In preferred embodiments the particulate is formed from nickel and is possessed of an apparent density as measured by ASTM standard B-329 of between about 0.75 and 1.50 grams/cm$^3$. Where such particulates are nickel, typically for, e.g. nickel flakes, a screen analysis would reveal in excess of approximately 90% of the nickel particles being retained on a #325 U.S. Standard Screen. One particularly preferred nickel particulate flake for use in the paint of the instant invention is a nickel flake material available from Novamet under the designations HCA-1, HCT, and HCTA. INCO type 255, 270 and 287 particulate nickel materials also find substantial utility in the practice of the invention.

The nickel or other particulate employed in the practice of the instant invention can include metal contamination. Such metal contamination should not rise to a level whereby conductivity of the particulate is impaired or to a point where corrosion products of the contaminant can cause difficulties in long term conductivity or adhesion performance of the paint.

In addition, a metallic particulate such as a nickel material optionally may be coated with another conductive metal such as silver, copper, or gold in the practice of the instant invention. With respect to gold and silver, for reasons related to cost, and, with respect to copper, for reasons related to corrosion, it is preferred that nickel particulate flake be used in an uncoated state however. Coated particulate carriers such as plastic, mica, carbon and the like plated with nickel, gold, silver or copper may be employed to form the metal particulate.

The latex employed in the practice of the invention includes a reactive, partially crosslinked polymer containing acidic functionality pendant from the backbone of the copolymer. The latex is formed of serum and copolymeric particles having an average size of between about 1000 and 5000 angstroms (100-500 nanometers) and preferably the particles range in size from about 1400 to 5000 angstroms (140-500 nanometers). The particulate copolymer is suspended within the serum in usual or conventional manner with the serum optionally including a suitable or conventional emulsifier(s), and residuals of a suitable or conventional free radical initiator(s), and/or a suitable or conventional electrolyte(s) for preventing agglomeration of the copolymer particles or for imparting freeze protection to the latex. Emulsifiers, free radical initiators, or electrolytes typically comprise much less than 5% by weight of the latex. Most typically, the latex is available in a 50—50 (by weight) suspension of copolymeric particles and serum with the serum being principally comprised of water.

The copolymers hereinafter, for convenience, interchangeably referred to as polymers, characterizing the latex and finding utility in the practice of the invention are characterized by a backbone. The backbone is a copolymer of at least two monomers selected from at least two subgroups of a group consisting of:(a) styrene; (b) acrylic esters having between about 5 and about 12 carbon atoms; (c) acrylonitrile or methacrylonitrile; (d) vinyl acetates; (e) vinyl or vinylidene chloride; (f) mono and dicarboxylic acids; (g) acrylamides; and (h) multi-functional acrylates. One of the monomers must be selected from (f), that is be a mono or dicarboxylic acid.

Styrene may be present in the polymer backbone in a weight percentage of between 0.5% and 99% and preferably not more than about 55% nor less than about 35%.

By acrylic esters what is meant is organic esters of acrylic acid or methacrylic acid of $C_4$-$C_{12}$ and preferably methyl, ethyl, n-butyl, or 2-ethylhexyl esters. The acrylic esters may be present in the polymeric backbone in a quantity of between about 0 and 95% by weight but preferably not less than about 38% nor more than about 90% by weight and most preferably not more than about 50% by weight. But where the acrylic ester is an ester of methacrylic acid, the acrylic ester is preferably 0 to 15% by weight of the polymer.

Acrylonitrile or methacrylonitrile, collectively termed acrylonitrile for convenience, may be present in the backbone in a quantity of between 0 and 40% by weight and preferably less than 20% by weight of the polymer.

Vinyl and vinylidene chlorides, where present in the polymer backbone, typically are present in a quantity not exceeding about 90% and preferably not exceeding about 50% by weight for vinyl chloride and 20% by weight for vinylidene chloride.

By mono and dicarboxylic acids, what is meant is unsaturated carboxylic acids of $C_3$-$C_{10}$ and preferably $C_3$-$C_5$. For dicarboxylic acids, maleic, fumaric and itaconic acids are preferred. For monocarboxylic acids, acrylic acid and methacrylic acids are preferred but crotonic, undecylenic, and sorbic acids are contemplated as within the purview of the invention. The mono and/or dicarboxylic acids are present in the backbone in a quantity of 0-20% by weight and more preferably between about 0.5 and 15% by weight of the polymer. The carboxylic acid monomer being polymerized into the backbone provides to the resulting polymer acidic functionality pendant from the polymer backbone. It is necessary that at least one mono or dicarboxylic acid be present in the backbone.

By acrylamides, what is meant is $CH_2CHCONR^1R^2$ or $CH_2C(CH_3)CONR^1R^2$ wherein $R^1$, $R^2$ may be hydrogen, hydroxymethyl, methoxymethyl, ethoxymethyl, butoxymethyl, and pentoxymethyl. The acrylamide is present in the polymer backbone in a quantity about 0 to 20% by weight of the polymer, preferably not more than about 15% and most preferably not more than about 5% by weight of the polymer.

By multi-functional acrylates what is meant is esters of poly-hydroxylated aliphatic compounds typified by structures such as

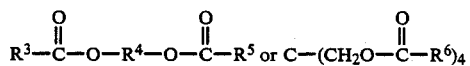

wherein $R^3$, $R^5$, $R^6$ are low molecular weight unsaturates of $C_2$-$C_6$ and preferably $C_2$-$C_3$ and $R^4$ is saturated and $C_2$-$C_{12}$. The multi-functional acrylate, if present, is present in the backbone in a quantity of not more than 5% by weight and preferably not more than about 2.5% by weight.

Polymers in latex form suitable for practicing the instant invention are available from The B. F. Goodrich Company under the commercial designations 2600×172, 2671, 2600×334, 660×13, 1800×73, 2600×315, 2600×288, 26796, 26120, 2600×337 and 2600×342 and mixtures thereof. Particularly preferred in the practice of the invention are: 2600×172; 2671; 2600×342; 2600×288; and mixtures of 2600×172 with 2600×337.

The paint of the instant invention includes a pH adjusting compound capable of adjusting an acidic pH in the paint. The acidic pH typically results from use of a latex including a polymer having pendant acidic functionality. pH adjustment should be to a value of between about 5 and about 11 and preferably between a value of about 6 and about 9. Typically amines such as ammonia and primary, secondary and tertiary amines are employed in adjusting the pH of the paint. These amines typically are $C_1$–$C_5$. Other suitable or conventional pH adjusting compounds are contemplated as being within the purview of the invention.

An air drying, preferably water soluble co-solvent is included in the paint. The co-solvent customarily is possessed of a boiling point greater than water. The co-solvent is substantially capable of coalescing particles of the latex to form a coherent coating upon a surface being painted. The co-solvent should be present in the paint in a quantity preferably not greater than about 40% by weight of the polymer present in the latex (on a polymer basis) being employed and much preferably not greater than about 30% by weight of the polymer present in the latex being employed in forming the paint. Each cosolvent preferably is present in the paint in a quantity of not greater than about 20% by weight. The actual quantity of co-solvent employed will be, to some extent, a function of the capabilities of the co-solvent for assisting the particles in establishing a desirable film to form a coherent paint coating. Depending on the selection of a particular polymeric latex, cosolvents typically widely used in the formation of latex paints may be employed in the practice of the invention. Preferred in the practice of the instant invention are: unsaturated glycols of $C_2$–$C_4$ such as ethylene glycol, propylene glycol or the like, as well as diethylene or triethylene glycol; mono- and dialkyl-ethers of ethylene or propylene glycol such as butoxypropanol and propoxypropanol and derivatives thereof widely marketed and available under the trade names CELLOSOLVE ® or PROPASOL ® available from Union Carbide, and their derivatives including acetates, methyl ethers and ethyl ethers; cyclohexane; elevated molecular weight alcohols such as TEXANOL ® ester-alcohols (2,2,4-Trimethyl1,3-pentanediol monoisobutyrate) of certain diols available from Eastman Chemical Products Inc.; 4-hydroxy-4-methyl-2-pentanone; aromatic based hydrocarbons such as toluol, xylol, or benzol; ISOPAR hydrocarbons available from Exxon; 2,4-pentanedione; suitable well-known other ketones, diols and glycols and mixtures of the foregoing. The selection of a particular cosolvent for implementing the instant invention may in part be governed by a capability for the solvent etching surfaces of plastic cabinetry or the like to which the paint is to be applied. A co-solvent having desirable etching capability can enhance the adherence properties of the paint coating applied to the cabinetry without damaging the substrate cabinetry.

Paint adhesion is particularly a concern with plastics such as NORYL ®, LEXAN ®, CALIBRE ™, STYRON ®, CYCOLAC ®, and GEON ® and may pose problems requiring trial and error solvent selection, and such selection methods should be regarded as the norm for application to these polyphenylene oxides, polycarbonates, polyvinyl chlorides, ABSs and polystyrenes.

The paint of the instant invention includes a film forming enhancer, typically a salt of at least one fatty acid for ease of dispersion. The fatty acid, whether in salt or other form, hereinafter shall be termed "salt" for convenience. When handling flake metallic particulates it is frequently preferable that the salt includes a salt of an unsaturate, the unsaturate salt being possessed of an iodine value of at least about 85 but not more than about 250. The fatty acid salt is present in the paint in a quantity of between about 1% by weight and 5% by weight of the nickel present in the paint. Typically any fatty acids in salt form are in an amine salt form.

Iodine value is a standard measure of unsaturation in a fatty acid, and a fatty acid or salt thereof employed in the practice of the invention when dispersing metallic flake materials much preferably includes at least one fatty acid having unsaturation characteristics. Other fatty acids having no unsaturation may be employed in forming any salt, but unsaturated fatty acids, it is believed, generally should comprise at least about 15% by weight of fatty acid introduced by salt form or otherwise, more preferably at least about 25% by weight and most preferably about 50% of the salt by weight.

Saturated fatty acids finding utility in the practice of the invention include preferably capric, pelargonic, and lauric acids but may include acids of $C_9$–$C_{18}$ typically.

The fatty acids having desirable unsaturate properties in the practice of the invention are selected from a group consisting of: palmitoleic, oleic, linoleic, linolenic, eleostearic, ricinoleic, stercullic, arachidonic, cetoleic, erucic, nervonic, mycolipenic acids and mixtures thereof, with palmitoleic, oleic, linoleic linolenic, and mixtures thereof being preferred as more readily commercially available. It is believed that other suitable or conventional unsaturated fatty acids can be employed in the practice of the instant invention. One particular blend of fatty acids including unsaturated fatty acids and finding particular utility in the practice of the invention is Raybo 6, principally an amine salt of oleic acid, available from The Raybo Chemical Company.

Other film forming enhancers may be employed in the practice of the invention such as suitable anti- or defoamers, but film foaming enhancers thus employed should be essentially free of silicones or silicates that can interfere with forming an integral, adhering paint film.

The paint optionally may include a particulate non-metallic filler such as carbon, silica (colloidal) or the like as a hardener. With the particulate non-metallic filler present in the paint formulation, the finished paint coating tends to be possessed of desirably harder surface characteristics. Carbon or colloidal silica may be introduced into the paint in quantities up to 10% by weight of the weight of nickel metallic particulate employed in the paint but it is preferred that any non-metallic particulate filler introduced into the paint be limited to 5% by weight and most preferably to not more than about 1% by weight of the weight of metallic particulate in the paint. Any suitable or conventional particulate carbon, colloidal silica or like material tending substantially to remain in suspension in paints formulated in accordance with the invention can be employed in the practice of the instant invention. Carbon blacks and colloidal silicas generally suitable for use in paint are well known.

Where a latex is being agitated, from time to time the inclusion of an antifoaming agent may be required. Typically an antifoaming agent where introduced for antifoaming properties rather than for film forming enhancement as set forth supra should be introduced to equal not greater than about 1% and preferably not greater than about 0.1% by weight of the paint being prepared.

Any suitable or conventonal antifoaming agent can be utilized which does not substantially detract from suspension of the metal particulates and other particulate materials within the paint. Particularly, FOAMMASTER ® 111 available from Henkle Process Chemicals Inc. has been found to be desirably efficacious in formulation of paints according to the invention. It is believed that antifoaming agents free of silicones or silicates perform best in the practice of the invention as silicones or silicates can substantially interfere with film forming capabilities of the paint.

Paint is made in accordance with the instant invention typically by first agitating the latex and introducing into the agitated latex the antifoaming compound, if any (where used for antifoam as opposed to film forming enhancement purposes). Typically the resulting blend is then agitated for at least about one minute. Agitation at this time may be accomplished at ambient temperature or at any elevated temperature preferably not greater than about 99° C. The co-solvent and water are then typically separately blended to form a mixture wherein the co-solvent comprises not more than about one part in three by weight of the blend of co-solvent and water and not less than about one part in thirteen by weight of the blend of co-solven and water. The blend of co-solvent and water are introduced into the mixture of latex and antifoaming agent under agitation and blended for at least about an additional minute. Again this agitation can be at ambient temperature or any elevated temperature preferably not greater than 99° C. The pH adjusting compound is then introduced under agitation and agitation is continued for at least about 2 minutes with the adjustment of pH to within the desired range of between 5 and about 11 and preferably between 6 and about 9 being confirmed by appropriate, well known means. Yet again this agitation can be at ambient temperature or any elevated temperature preferably not greater than 99° C. Achievement of the desired pH is essential to avoid coagulation upon heating of the latex.

Typically, separately, the film forming enhancer is typically blended with water in a ratio whereby the film forming enhancer comprises not more than one part in three of the blend of water and film forming enhancer, and not less than about one part in eleven of the blend of film forming enhancer and water. The blended film forming enhancer and water are then introduced into the pH adjusted mixture under agitation and agitation is continued for at least about 3 minutes. Still again this agitation can be at ambient temperature or any elevated temperature preferably not greater than 99° C.

The metal particulate is then blended into the paint mixture under agitation which may be at ambient temperature or at any elevated temperature preferably not in excess of 99° C. The paint is then held, typically under agitation at a temperature of at least 50° C., preferably greater than 75° C. and most preferably greater than 85° C. for at least one hour, but at least for a period of time sufficient to assure full dispersion of the metal particulate within the paint blend and also sufficient to assure an accommodation of the latex within the paint to the metal particulate whereby following completion of agitation, the paint requires no further aging before use to form a coating in an effective thickness having a resistivity of not more than 10 $\Omega$/square, desirably not more than 5 $\Omega$/square and preferably not more than 2 $\Omega$/square. Typically a hold time of two hours, agitated or not, at 95° C. is thereby required with about four hours being required at about 85° C., about eight hours at about 75° C. and about sixteen hours at about 50° C. being necessary to assure the desired resistivity of less than 2 $\Omega$/square for most suitable latex systems. The time and temperature is to a degree subject to experimentation for each latex system employed.

Should the metal particulate be a powder, it is necessary that the paint, either prior to or after being held at the elevated temperature, be subjected to elevated destructive agitation. This elevated destructive agitation must be to an extent and for a duration at least sufficient to increase the paint's Hegman reading, ASTM Standard D-1210-79, by at least 0.25, a reflection of reduced particle size by about 3 microns associated with a destructive grinding of the particles by the elevated destructive agitation. Destructive agitation may be elevated shear or grinding which may be accomplished employing Eiger motor mills, DAYMAX machine, sonic agitation, ball milling or rotating stone paint mills as is well known in pigment dispersion in the paint manufacturing industry or in a lab scale Waring blender. Preferably this Hegman is about 0.50 reflecting about a 6 micron particle size reduction.

Where it is desired that particulate carbon or colloidal silica be introduced into the paint blend, this particulate may be introduced after introduction of the metal particulate or at any other point during processing where not detrimental to the processing or performance of the paint. Preferably, carbon or colloidal silica is introduced under agitation and agitation is continued for at least about 10 minutes thereafter at the ambient temperature or the elevated temperature to assure adequate dispersion of the particulate.

Finished paint generally is filtered preferably through a #109 U.S. Standard Sieve typically formed of nylon or cheesecloth.

The following examples further illustrate the instant invention. In the examples that follow, unless otherwise stated, batches of approximately 5 gallons in volume were prepared employing a Lightnin' Mixing Equipment Co. mixer, Serial No. 3-37326. In dispersing metallic particulate powders, as distinguished from flakes, the use of a high shear DAYMAX (Day Mixing, Cinn. Ohio), motor mill (Eiger Machinery), ball mill, SONOLATOR ® Model A (Sonic Corp) or the like is necessary to finish a batch prior to filtering and canning.

EXAMPLE 1

27,260 grams of 50% solids latex and 39 grams of Henkle FOAMMASTER 111 were agitated together for one minute. 1363 grams butyl CELLOSOLVE co-solvent was blendingly added with 4864 grams of distilled water and the resulting blend agitated for one minute. To the resulting paint, 323 grams of concentrated NH$_4$OH was added under agitation during three minutes. 57 grams of Raybo 6 was blendingly added together with 2014 grams H$_2$O under agitation for five minutes. 387 grams of carbon black were added thereafter and mixing was continued for 25 minutes, all at ambient temperature to form a K-B blend batch. A similar blend was made without carbon black and was designated a B blend batch. Each K-B blend was processed through a DAYMAX mixer at low speed as a precaution to disperse the carbon black.

EXAMPLE 2

Three K-B batches were made in accordance with Example 1 employing B. F. Goodrich 2600×172 latex. To three 450 gram allotments of these K-B batches were added under agitation 479.6 grams NOVAMET HCA-1 nickel flake and 45.5 grams $H_2O$. In addition 9.3 grams RAYBO 6 was added to one allotment and 2.3 grams RAYBO 6 to another. Agitation was continued at ambient until blending was complete. The allotments were heated at 95° C. for two hours. After cooling, and filtering through a nylon #109 U.S. Standard Sieve each allotment was spray applied to achieve a 2.5 mil thickness on general purpose ABS plastic, dried, and then tested for resistivity following initial application. The spray coated ABS plastic samples were then subjected to humidity aging at 70° C., 95% relative humidity for 72 hours and retested for resistivity. The initial, that is after spraying, and final, that is after spraying and humidity aging testing, resistivity values for each of the paints is displayed in Table I with the resistivity units being $\Omega$/square. The 9.3 gram allotment was repeated employing a B blend batch and similarly tested.

TABLE I

| Added Raybo 6 | Initial $\Omega$/square | Humidity Aging $\Omega$/square |
| --- | --- | --- |
| 0 | .7 | 3.8 |
| 2.3 grams | 0.4 | 1.9 |
| 9.3 grams | 0.3 | 1.1 |
| 9.3 grams (no carbon black) | 0.3 | 1.0 |

Raybo 6 appears to assist in achieving and maintaining desirably low resistivities with the nickel flake material.

EXAMPLE 3

Additional batches of the paints were manufactured in accordance with the 9.3 gram Raybo 6 allotments of Example 2 employing in lieu of Raybo 6 as a film forming enhancer 9.3 gram quantities Lauric, Capric, Pelargonic and Oleic acids (n-butyl salts). The resulting coatings were sprayed in accordance with Example 2 to a 2.5 mil thickness, dried, tested for resistivity, subjected to humidity aging to 70° C., 95% relative humidity for 72 hours, and retested for resistivity in accordance with Example 2, the resistivities being displayed in Table II.

TABLE II

| Fatty Acid | Initial $\Omega$/square | Humidity Aging $\Omega$/square |
| --- | --- | --- |
| lauric | 0.3 | 1.1 |
| capric | 0.35 | 3.3 |
| pelargonic | 0.3 | 1.8 |
| oleic | 0.2 | 0.9 |

EXAMPLE 4

Two K-B batches were made in accordance with Example 1 and made further in accordance with Example 2 employing 9.3 grams Raybo 6; but utilizing agitation but no heat for the time period the batches in Example 2 were heated. The batches were sprayed on ABS general purpose plastic, dried, and initial resistivity measurements taken. The first unheated batch was separately sprayed the day after making, 5 days after making, 8 days after making, 11 days after making, 14 days after making, 28 days after making and 44 days after making. The respective resistivities for the unheated batch in films of a sprayed 2-3 mil thickness in $\Omega$/square were 1.1, 0.7, 0.5, 0.5, 0.5, 0.4 and 0.4. The second batch was sprayed the day after making, 2 days after making, 7 days after making, and 100 days after making. The resistivities in films of a sprayed 2-3 mil thickness in $\Omega$/square initially for each spraying were respectively 0.8, 0.6, 0.4, and 0.3. Clearly then, for paint unheated before spraying, as the paint ages, the initial resistivity after spraying improves. It would appear that aging for at least a week significantly improves initial resistivity values, and that for aging of at least a month (about 30 days) substantial resistivity improvements can be achieved. Conversely, with heated batches, the aged values for unheated batches can be achieved immediately without aging, as shown by Example 2.

EXAMPLE 5

A K-B batch was made in accordance with Example 1 and processed in accordance with the Example 2 450 gram allotment containing 9.3 grams Raybo 6. Heated for 2 hours at 95° C., cooled, 10 parts per hundred (solids in the latex basis) each of Toluene and TEXANOL were then added and the batch was filtered, sprayed to 2.5 mils and dried; the initial resistivity was 0.2 $\Omega$/square and after humidity aging the resistivity was 0.6 $\Omega$/square.

EXAMPLE 6

Example 2 was repeated and the 9.3 gram Raybo 6 allotment was spray applied in 2.5 mil thicknesses to to NORYL ®, LEXAN ®, PUC, ABS, Polystyrene and SMC/BMC thermoset polyester glass composites. All applications both before and after temperature humidity were subjected to adhesion tests pursuant to ASTM Standard D-3359-78, Method B, and achieved a 5B rating.

EXAMPLE 7

B blend batches were made in accordance with Example 1 using the latexes set forth in Table III to achieve a 74/26% by weight ratio of nickel to polymer (100% solids) in the final paint to be produced. Water was adjusted in the B blend batches to yield 39.6% total solids. To 450 grams allotments of each batch were added under agitation employing a blender blade on a high speed air driven agitator, 480 grams INCO #270 powder, 9.3 grams Raybo 6, and 45.6 grams water, agitation continuing for approximately 5 minutes. The batches were heated not under agitation for 2 hours at 95° C., cooled, filtered as per Example 2, and sprayed to approximately 2.5 mils on ABS. Equivalent batches were prepared but not heated, being held at ambient temperature for the two hours instead, and then likewise sprayed. Resistivities of all sprayed samples after drying were determined and the samples were humidity aged for 96 hours at 43° C. and 90% relative humidity. Resistivities were then redetermined. Results are shown in Table III.

In view of Example 7, heating appears to aid in performance of the paint but does not cause latex coagulation. Nickel is well-known to dissolve in organic acids at moderate temperatures (60°-100° C.) as shown by U.S. Pat. No. 4,244,938, and since it is well-known that di-valent salts such as Ni or Zn salts coagulate latexes, it is therefore surprising that an effective paint can be made in accordance with heating and/or destructive agitation such as high shear agitation contemplated by the invention.

TABLE III

| No. | Latex Copolymer[1] of K-B Batch | With Source Acid[2] | Latex Acid % | RESISTIVITY Ω/SQ. No Heat | RESISTIVITY Ω/SQ. Heat |
|---|---|---|---|---|---|
| 1. | nBa, STy, NMA, AN | AA | 26–34 | 0.7 (6.0) | 0.3 (2.1) |
| 2. | nBa, STy, NMA, AN | None | 0 | coagulates | coagulates |
| 3. | nBa, STy, NMA | AA | 17–23 | 2.7 (4.3) | 0.84 (2.46) |
| 4. | nBa, STy, NMA | IT | 23–29 | 3.03 (4.10) | coagulated |
| 5. | EtA, STy, NMA | MAA | 7–10 | 2.15 (4.10) | 0.65 (1.80) |
| 6. | EtA, AN, NMA | AA | 17–23 | 1.7 (2.0) | 0.48 (0.95) |
| 7. | nBa, STy, AN | AA | 26–34 | 1.0 (3.35) | 0.42 (0.8) |

[1]nBA — n-butyl acrylate
EtA — ethyl acrylate
STy — styrene
NMA — N—methylol acrylamide
AN — acrylonitrile
ACM — acrylamide
[2]AA — acrylic acid
MAA — methacrylic acid
IT — itaconic acid
[3]Parenthesis indicate after humidity aging

EXAMPLE 8

Example 7 was repeated as to entry #1 in Table III using a K B blend batch. In addition, after heating 16.8 grams Toluene, 16.8 grams TEXANOL, and 16.8 grams ethylene glycol were included, and the formulation was diluted with water, processed through on Eiger motor mill using stainless steel balls, for one hour, filtered, and sprayed. For the heated material the initial resistivity was 0.2 Ω/sq. and after humidity aging for 72 hours at 70° C. and 95% relative humidity, 0.7 Ω/sq.

EXAMPLE 9

Paint in accordance with Example 2 prepared employing a polymer latex containing no acidic functionality pendant from the backbone coagulated. Backbone acidity would appear therefore essential to an effective paint in accordance with the invention.

EXAMPLE 10

450 gram paint allotments were prepared in accordance with Example 2 employing 2600×172 latex and INCO 270 nickel powder in ratios of Ni/polymer(100% solids basis) as shown in Table IV except that the Raybo 6 content was adjusted to be 1% of the total weight of the paint being prepared. Two allotments included in addition TEXANOL, toluene, and ethylene glycol in the quantities shown in Example 8, listed in Table IV as "cosolvent mixture". The paints were dispersed employing the dispersion techniques shown in Table IV. One sample was permitted to stand for six months before spraying, as noted. Unless Waring blender times are noted, Waring blender times were sufficient to wet all powder added to the allotments and to cause the dispersion of all powder clumps. Each allotment was sprayed on ABS to 2.5 mils, dried at ambient temperature and tested for surface resistivity, then humidity aged for 72 hours at 95% humidity and 70 degrees Centigrade.

It should be clear from Example 10 that high shear or grinding dispersion of the metal powder assists in achieving low surface resistivities in the range of 2 Ω/square or lower. The inclusion of additional, carefully selected, appropriate co-solvents, equally, can assist in achieving and maintaining desirably low surface resistivities.

TABLE IV

Surface Resistivity Before/After

| Ni/polymer | Dispersion | Humidity Aging Ω/Sq. |
|---|---|---|
| 85/15 | Waring Blender | 0.4/50 |
| 85/15 | Waring Blender followed by 24 hours @ 60° C. | 0.4/1.8 |
| 75/25 | Waring Blender followed by 6 months standing | 0.4/2.4 |
| 75/25 | Waring Blender followed by 24 hours @ 60° C. | 0.4/1.7 |
| 65/35 | Waring Blender followed by 24 hours @ 60° C. | 0.4/1.7 |
| 75/25 | Ball Mill followed by 24 hours @ 60° C. | 0.3/2.1 |
| Aging Conditions: 70° C., 95% R.H., 14 days | | |
| 74/26 | Sonic Dispersion followed by 2 hours @ 90° C. | 0.3/1.6 |
| +Cosolvent Mixture | | 0.25/0.5 |
| 85/15 | Sonic Dispersion followed by 2 hours @ 90° C. | 0.3/1.3 |
| +Cosolvent Mixture | | 0.3/0.6 |
| Aging Conditions: 70° C., 95% R.H., 72 hours | | |

The aging experiments on the sonic dispersed samples and the others above were conducted for different time periods, but it has been our experience that all the changes in surface resistivity take place in the first 72 hours of aging and the additional time is unnecessary.

EXAMPLE 11

Example 10 is repeated with B. F. Goodrich 2671, 2600×288, 2600×334, and 2600×342 latexes and INCO 255 Nickel powder without materially different results.

EXAMPLE 12

Two 450 gram allotments of paint were made in accordance with Example 2 employing INCO 270 Ni powder and 2600×172 latex in a weight ratio of 62.5/37.5(100% solids basis) and hand stirred in lieu of mechanical mixing to simulate low shear inclusion of the powder. One was thereafter heated for two hours at 95 degrees Centigrade without agitation, but the other, contrary to Example 2, was allowed to stand for 2 hours without agitation. Sprayed upon ABS to a 3.0 mil thickness, dried and tested for surface resistivity the unheated sample demonstrated 0.9 Ω/sq. while the heated sample demonstrated 0.4 Ω/sq. The sprayed samples were then humidity aged for 14 days and retested for surface resistivity whereupon the unheated sample demonstrated 5.8 Ω/sq. while the heated sample demonstrated 2.4 Ω/sq. It follows therefore that heating after preparation can substantially assist in lowering the aged surface resistivity of coatings prepared in accordance with the invention.

While a preferred mode of the invention has been shown and described in detail, it should be apparent that various modifications may be made thereto without departing from the scope of the claims that follow.

What is claimed is:

1. An electrically conductive water based, air dried, paint comprising: metallic particulate selected from a group consisting of copper, silver, iron phosphide, gold, nickel, mixtures thereof, and substrates coated therewith, the particles having dimensions not greater than passable through a spray nozzle intended for applying the paint;

polymeric latex, the polymer having a molecular weight of at least about 90,000, a backbone, and pendant acidic functional moieties in the backbone in sufficient quantity to provide the polymer with an acid number of at least about 7 but not more than about 195, the latex being capable of withstanding heating to at least 50° C. for a period of at least 1 hour, the latex being present in the paint in a ratio of about 15% by weight to about 100% by weight (polymer basis) of the metallic flake present in the paint;

an air drying, co-solvent having a boiling point greater than water and being capable of agglomerating particles of the latex polymer to form a coherent coating upon a surface being painted in a quantity of at least 2% by weight and 40% by weight of polymer in the latex;

a pH adjusting compound in a quantity sufficient to adjust the pH of the paint to between about 5 and 11; and at least one non-silicone, non-silicate based film forming enhancer in a quantity of between about 1% by weight and 5% by weight of the metallic particulate present in the paint.

2. The paint of claim 1 including an antifoaming agent in a quantity not exceeding about 1% by weight of the nickel in the paint.

3. The paint of claim 1 including finely divided non-metallic filler in an amount not exceeding about 5% by weight of the nickel in the paint.

4. The paint of claim 1, the co-solvent being selected from a group consisting of: $C_2-C_4$ glycols, ester alcohols having a molecular weight exceeding about 118, mono ethers of ethylene, propylene or butylene glycols, and acetates thereof, or methyl or ethyl esters thereof, 4-hydroxy-4-methyl-2-pentanone, and mixtures thereof.

5. The paint of claim 1, the latex being partially cross-linked, having pendant carboxylate based moieties, and having a latex particle size of between about 170 and 500 nanometers.

6. The paint of claim 1, the pH adjusting compound being a fugitive amine selected from a group consisting of primary and secondary amines of $C_1-C_5$ and ammonia.

7. The paint of claim 1, the film forming enhancer having a salt of at least one fatty acid, the salt having an iodine value of at least about 85 but not more than about 250 and including an unsaturate selected from a group consisting of palmitoleic, oleic, linoleic, eleostearic, sterculic, arachidonic, ricinoleic, cetoleic, erucic, nervonic, mycolipenic, linolenic acids and mixtures thereof in a proportion of at least about 25% by weight of the fatty acid salt.

8. The paint of claim 7, the unsaturate comprising at least about 50% by weight of the fatty acid salt.

9. An electrically conductive water based air dried paint comprising:nickel particulate, the particulate being of dimensions not greater than passable through a spray nozzle intended for applying the paint;

polymeric latex, the polymer having a molecular weight of at least about 90,000, a backbone, and carboxylate based functional moieties pendant from the backbone in a quantity sufficient to provide the polymer with an acid number of at least about 10 but not more than about 195, the latex being capable of withstanding heating to at least 50° C. for a period of at least 1 hour, the latex being present in the paint in a ratio of about 15% by weight to about 100% by weight (polymer basis) of the weight of nickel present in the paint;

an air drying, water soluble, co-solvent selected from a group consisting of:$C_2-C_4$ glycols, ester alcohols having a molecular weight exceeding about 118, monoethers of ethylene, propylene, or methylene glycols, acetates thereof or methyl or ethyl ethers thereof; and 4-hydroxy-4 methyl-2 pentanone, and mixtures thereof;

a pH adjusting compound selected from a group consisting of primary and secondary amines of $C_1-C_5$ and ammonia in a quantity sufficient to adjust the pH of the paint to between about 5 and about 11; and film forming enhancer of non-silicone, non-silicate base, present in the paint in a quantity of about 1% by weight and about 5% by weight of the nickel present in the paint.

10. The paint of claim 9, the latex including a copolymer of at least two monomers selected from a group consisting of styrene, acrylic esters having between about 5 and about 12 carbon atoms, acrylonitrile, methacrylonitrile, vinyl acetates, multi-functional acrylates, multi-functional methacrylates, vinyl or vinylidene chloride, and acrylamides, and including at least one mono or dicarboxylic acid at least one monomer being a mono or dicarboxylic acid.

11. The paint of claim 12, the pH being adjusted to be between about 6 and 9.

12. The paint of claim 11, the film forming enhancer being a salt of at least one fatty acid, the salt having an iodine number of at least 7 but not more than about 195, and the fatty acid including an unsaturate selected from a group consisting of palmitoleic, oleic, linoleic, eleostearic, sterculic, arachidonic, ricinoleic, cetoleic, erucic, nervonic, mycolipenic, linolenic acids and mixtures thereof in a proportion of at least about 25% by weight of the fatty acid.

13. The paint of claim 12 including an antifoaming agent in a quantity not exceeding about 1% by weight of the nickel in the paint.

14. The paint of claim 12 including finely divided non-metallic filler in an amount not exceeding about 5% by weight of the nickel in the paint.

15. The paint of claim 12, the unsaturate comprising at least about 50% by weight of the fatty acid.

16. A method for forming a paint having therein suspending metal particulates selected from a group consisting of copper, silver, iron phosphide, gold, nickel, mixtures thereof and substrates coated therewith, comprising the steps of: agitating a partially cross-linked polymer latex, the polymer having a molecular weight of at least about 90,000, a backbone, and pendant acidic function moieties therefrom in sufficient quantity to provide the polymer with an acid value of at least about 7 but not more than about 195;

adding under agitation an air drying, co-solvent having a boiling point greater than water and capable of agglomerating particles of the latex to form a coherent coating upon a surface being painted, the co-solvent and a quantity of water at least twice and not more than twelve times the weight of co-solvent;

adding under agitation a quantity of a pH adjusting compound sufficient to adjust the pH of the resulting mixture to between about 5 and about 11.

adding under agitation film forming enhancer and a quantity of water at least about twice and not more than about ten times the weight of the fatty acid;

adding under agitation a quantity of the metal particles having a dimension not greater than passable through a spray nozzle intended for applying the paint and continuing agitation for a time period sufficient to suspend the metal particles;

providing the latex on a 100% polymer basis and the co-solvent and the film forming enhancer on an undiluted basis in a weight ratio to the metal flakes, respectively, of: about 15% to about 100%; about 2% to about 40%; about 1% to about 5%;

Applying heat to the resultant paint and maintaining the same for at least 1 hour at at least 50° C.; and filtering the resulting mixture.

17. The method of claim 13 including at least one of the steps of:(i) introducing an antifoaming agent in a quantity of not more than about 1% by weight of the metal particulates into the agitated latex; and (ii) introducing finely divided non-metallic filler in a quantity of not more than about 5% of the weight of the metal flakes into the paint under agitation.

18. The method of claim 17 including the step of providing in the film forming enhancer a salt including a fatty acid component, the salt having an iodine value of at least about 85 but not more than about 250, the fatty acid being first the unsaturate selected from a group consisting of palmitoleic, oleic, linoleic, eleostearic, sterculic, arachidonic, ricinoleic, cetoleic, erucic, nervonic, mycolipenic, linolenic acids and mixtures thereof in a proportion of at least about 25% by weight of the fatty acid.

19. The method of claim 17 including the step of providing a co-solvent selected from a group consisting of: ester alcohols having a molecular weight exceeding about 118, mono-ethers of ethylene, propylene or methylene glycols, and acetates thereof, or methyl or ethyl esters thereof, 4-hydroxy-4-methyl-2-pentanone, and mixtures thereof.

20. The method of claim 17 including the step of providing a latex selected from a group consisting of partially cross linked latexes having pendant carboxylate based moieties and having a latex particle size of between about 100 and 500 nanometers.

21. The method of any one of claims 16-20 including the step of providing a pH adjusting compound selected from a group consisting of primary, secondary, and tertiary amines of $C_1$-$C_5$ and ammonia.

22. The method of any one of claims 13-18, the latex being a copolymer of at least two monomers selected from a group consisting of: an unsaturated carboxylic acid containing monomer, 0.5-0.15% by weight; styrene 0.5-65% by weight; acrylate or methacrylate esters, 35-90% by weight; acrylonitrile or methacrylonitrile, 0-20% by weight; an acrylamide or N-substituted acrylamide, 0-15% by weight; and a multi-functional acrylate selected from a group consisting of ethylene glycol, dimethylacrylate, trimethyl propane, and trimethylacrylate, 0-5% by weight, with at least one of the monomers being an acid.

23. The paint of claims 1-12, the latex being a copolymer of at least two monomers selected from a group consisting of: an unsaturated carboxylic acid containing monomer, 0.5-15% by weight; styrene, 0.5-65% by weight; acrylate or methacrylate esters, 35-90% by weight; acrylonitrile or methacrylonitrile, 0-20% by weight; an acrylamide, 0-15% by weight; and a multi-functional acrylate or methacrylate selected from a group consisting of ethylene glycol dimethylacrylate, trimethylol propane trimethacrylate, 0-5% by weight.

24. The paint of claim 23, the metallic particulate being formed of one of nickel or a nickel coated substrate.

25. The paint of any one of claims 1-12 and 20-21, the polymer forming the polymeric latex being a core-shell structure having a substantial majority proportion of backbone pendant acidic functionality present in the structure present in the shell.

26. In the method of claim 16 the metal particulate being introduced under agitation and being thereafter held at at least 75° F. for at least 1 hour thereafter under agitation.

27. In the method of claim 16 the metal particulate being introduced under agitation and being held at at least 85° F. for at least 1 hour thereafter under agitation.

28. In the method of any one of claims 16-21 and 26-27, the particulate being a nickel powder and the paint being subjected to elevated shear for a time period sufficient to raise a test value for the paint under ASTM Standard D-1210-79 by at least 0.25.

29. In the paint of claim 9, the polymeric latex being capable of withstanding heating to at least 75° F. for at least 1 hour.

30. In the paint of claim 24 the metal particulate being introduced under agitation and being held at at least 75° F. for at least 1 hour thereafter under agitation.

31. In the paint of claim 24 the metal particulate being introduced under agitation and being held at at least 85° F. for at least 1 hour thereafter under agitation.

* * * * *